(12) United States Patent
Colburn et al.

(10) Patent No.: US 7,344,955 B2
(45) Date of Patent: Mar. 18, 2008

(54) CUT-AND-PASTE IMPRINT LITHOGRAPHIC MOLD AND METHOD THEREFOR

(75) Inventors: Matthew E. Colburn, Hopewell Junction, NY (US); Yves C. Martin, Ossining, NY (US); Theodore G. van Kessel, Millbrook, NY (US); Hematha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 10/992,072

(22) Filed: Nov. 19, 2004

(65) Prior Publication Data

US 2006/0110890 A1    May 25, 2006

(51) Int. Cl.
*H01L 21/76*    (2006.01)
(52) U.S. Cl. .................. 438/401; 438/692; 438/706; 438/738; 438/745; 438/748; 257/E21.024

(58) Field of Classification Search .................. None
See application file for complete search history.

(56) References Cited

U.S. PATENT DOCUMENTS

| 5,756,234 | A   | * | 5/1998  | Groves et al. ................ 430/5 |
| 6,485,870 | B1  | * | 11/2002 | Uchikawa ................... 430/5 |
| 6,814,898 | B1  | * | 11/2004 | Deeman et al. ............ 264/1.33 |
| 2003/0205658 | A1 | * | 11/2003 | Voisin ................. 249/187.1 |
| 2004/0021866 | A1 | * | 2/2004  | Watts et al. ............ 356/401 |

* cited by examiner

*Primary Examiner*—Michael Lebentritt
*Assistant Examiner*—Kyoung Lee
(74) *Attorney, Agent, or Firm*—Ido Tuchman, Esq.; McGinn IP Law Group, PLLC

(57) ABSTRACT

A method (and apparatus) of replicating a pattern on a structure, includes using imprint lithography to replicate a pattern formed on a first structure onto a portion of a second structure.

7 Claims, 5 Drawing Sheets

200

Fig. 3
300
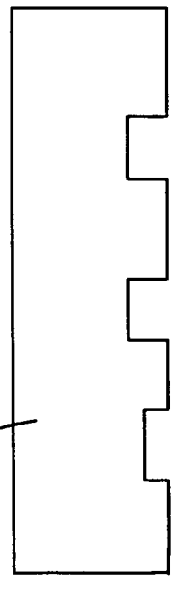
Fig. 3A
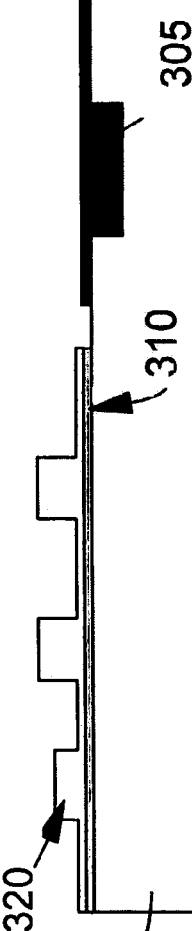
Fig. 3B
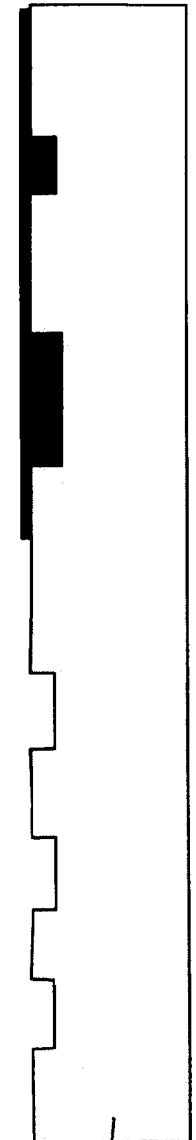
Fig. 3C

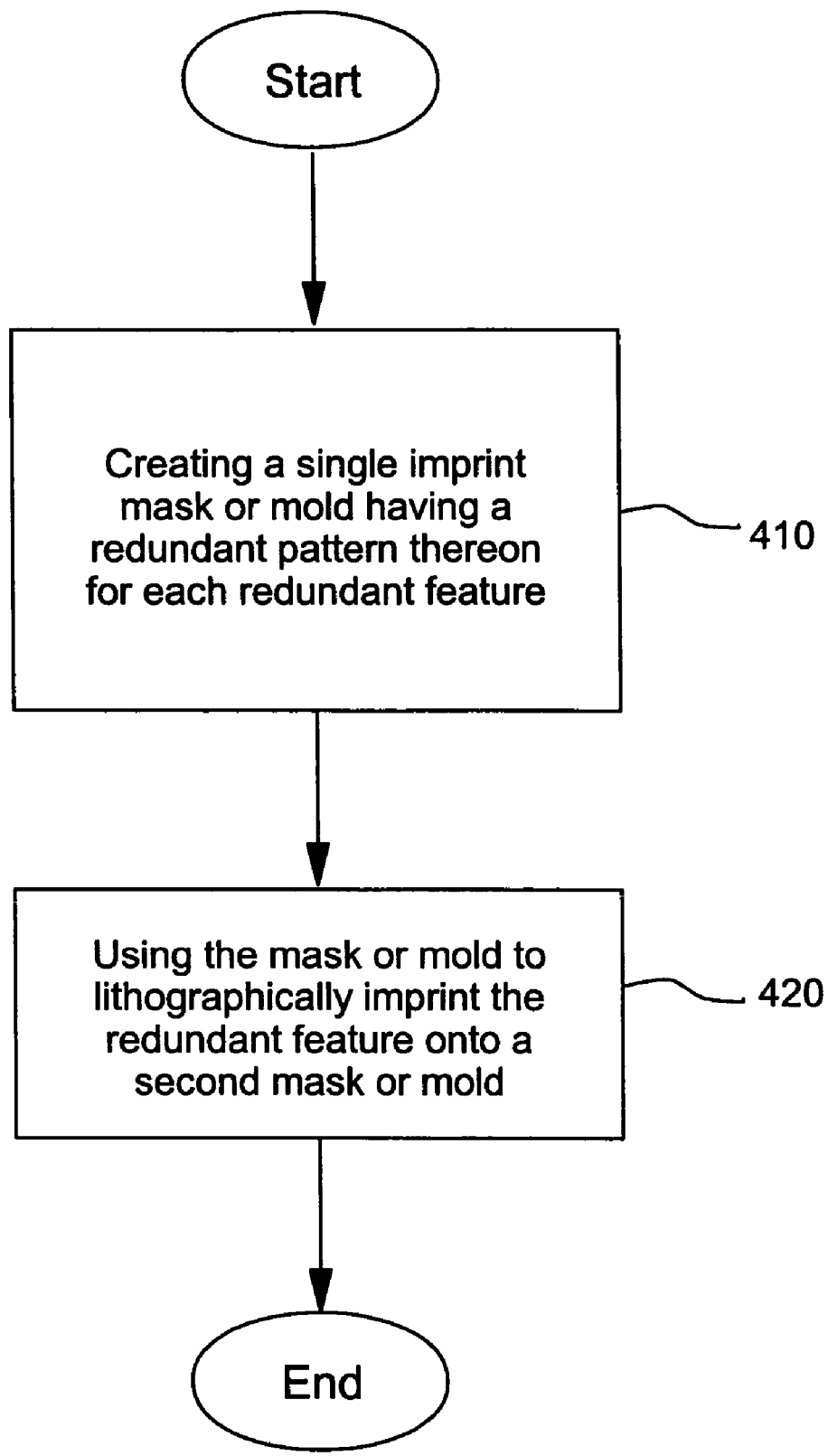

CUT-AND-PASTE IMPRINT LITHOGRAPHIC MOLD AND METHOD THEREFOR

BACKGROUND OF THE INVENTION

1. Field of the Invention

The present invention generally relates to a method (and resulting lithographic mask or mold structure) to reduce the cost of fabricating a lithographic mask (or mold) by spatially segmenting the process to employ one or more independently verified multi-use imprint sub masks.

2. Description of the Related Art

Hereinbelow, the term "mask" is used to refer to an optical lithographic mask, and "mold" is used to refer to an imprint lithographic mold.

Present methods of mask making typically create (e.g., write) an entire mask (e.g., which typically contains at least one chip, but possibly as many as 4, 8 or 20 chips on a mask), and then verify the entire mask. However, as ground rules evolve to smaller and smaller dimensions (and thus as chips become smaller and smaller), this process (and the tools needed to produce the chip) becomes exponentially more expensive.

The construction of a mask is usually performed using e-beam lithography. Once constructed, the mask is then inspected and, if necessary, repaired. The mask write time and subsequent inspection is by far the longest part of the process. For example, a critical mask (e.g., using optical phase correction or OPC) may take 24-48 hours to print using the e-beam tool, but may take days to inspect. Hence, the inspection process (which may include some repair time of the defects found during the inspection) takes relatively the most time.

A reason for the write time and inspection time being so lengthy is that there is a combinatorial explosion in the number of features, in that as each feature becomes smaller the number of features which occur on a given mask increases exponentially. While this may be advantageous for the consumer since they obtain a product with much functionality at presumably less cost, fabrication becomes much more difficult since each feature must be checked.

That is, the features must be perfect since the mask will be used to replicate potentially millions of chips. Additionally, the mask cannot be inspected with an ordinary microscope, but instead a scanning electron microscope (SEM) must be used which is very expensive and time consuming.

Additionally, traditional mask making employs photolithography or e-beam techniques to write the pattern in photoresist which is subsequently developed and etched.

The traditional mask making process itself introduces a multitude of distortions and defects that must be individually corrected and inspected. The serial printing and inspection of lithographic masks (or molds) is expensive and time-consuming. A phase shift mask might cost $150,000 and may require a month to fabricate and inspect.

Additionally, it is often observed that photolithographic mask features are typically 4 times (e.g., 4×) the final feature ground rule dimensions, and therefore require less precision. The use of phase shift features in optical masks dramatically impacts this observation by introducing additional precision requirements and topography that drive the tolerances to 1×.

SUMMARY OF THE INVENTION

In view of the foregoing and other exemplary problems, drawbacks, and disadvantages of the conventional methods and structures, an exemplary feature of the present invention is to provide a structure (and method for making the structure) in which imprint lithography is used to produce features with molecular fidelity.

In a first aspect of the present invention, a method of replicating a pattern on a structure, includes using imprint lithography to replicate, with molecular fidelity, a pattern formed on a first structure onto a second structure.

In a second exemplary aspect of the present invention, a method of forming a chip, having first and second areas, includes forming, in the first area, an embedded portion of the chip, forming, in the second area, a non-embedded portion of the chip, and inspecting the non-embedded portion of the chip without inspecting the embedded portion of the chip.

In a third exemplary aspect of the present invention, a method of forming a redundant pattern on multiple masks or molds, includes forming an imprint mold for a single redundant element and inspecting the imprint mold, and lithographically imprinting the pattern on the mold onto multiple product masks or molds.

In a fourth exemplary aspect of the present invention, an apparatus for replicating a pattern on a structure, includes one of a mold and a mask having a predetermined pattern formed thereon, and a lithographically imprinting device for imprinting the predetermined pattern onto a substrate, to replicate, the predetermined pattern formed on the one of the mold and the mask onto the substrate.

Thus, the present inventors have recognized that many lithographic levels on a given product contain patterned regions that are common to more than one product. Examples may include embedded RAM, SRAM, processor elements etc. In addition, it is often common to have more than one chip on a single mask (i.e., 2×2 array).

Finally, patterns may be generated using non-traditional means such as self assembly and then replicated to cover larger or specific areas on a mask. Diblock co-polymer is an example of such a process. In this case, the diblock chemistry results in a film with, for example, 20 nm holes in a hexagonal array. A reactive ion etching (RIE) is performed using the perforated film as an etch mask resulting in a hole pattern being etched in a substrate material. It is not presently practical to produce this pattern by other means such as e-beam lithography. Because this is a delicate chemical process, it is difficult to reproduce repeatably time after time. If a single desired instance is produced, then it can be copied, replicated and/or relocated on a mask.

Further, the inventors have recognized that imprint lithography offers a way to faithfully reproduce a pattern on a one-to-one basis without distortion. In this regard, imprint lithography is an inherently 1× process.

In addition, as noted above, imprint lithography faithfully reproduces the mask pattern, often to molecular dimensions. By this, it is meant that features on the imprint mask (or mold) are the same size and in the same relative location as the features printed on the chip.

Thus, by using imprint lithography, the inspection time is significantly reduced.

More specifically, since the imprint lithography reproduces a pattern with features with molecular fidelity, in cases calling for a multi-chip mask if one produces a single instance of a chip, which is perfect and which is referred to as the "master", then it is possible to produce replicas of the chip (in the case of a multi-chip mask) which are similarly accurate (perfect) and which therefore would not need an inspection, or at least not a rigorous inspection as that for the first chip ("master").

Hence, if the chip is perfect (e.g., defect-free) in one area, then replicas of the chip likewise should be defect-free in all areas.

The present invention takes advantage of such a technique by using a cut-and-paste mask making technique in which the chip (or a portion of a chip or pattern) is replicated, to take advantage of the savings that occur by not having to perform as an involved, rigorous inspection or printing on it.

Hence, in the case of a common, 4-chip mask, there might be a factor of three (3) improvement in costs. The more chips on the mask, the greater the savings will be.

Thus, with the 4-chip mask, first one would start by having an existing pattern on the mask, and then that pattern would be repeated a plurality of times (e.g., 4 times) on the mask, either directly 4 times, or in the case of existing patterns, then the chip could be added thereto.

In addition to chip patterns in the conventional sense, pattern topography information can be cut and pasted with similar cost improvements. Thus, the diblock pattern described above can be replicated over large areas or portions placed in discrete locations. Any topography resulting from self assembly, a biological process, an optical interference process etc. can be replicated and copied to other areas.

It is a well known attribute of two-dimensional self assembly processes that long range order is difficult to achieve.

FIG. 5 illustrates this situation, and shows the aforementioned diblock copolymer film having a 20 nanometer hole pattern. It is noted that there is a clear hexagonal pattern on a local scale, but long range order is poor (i.e., the diblock periodicity is poor).

This is a good example of a situation where if a portion of the pattern can be made perfect (as in the present invention), it can be copied and replicated using cut-and-paste imprint lithography and extended to larger areas or used to advantage in discrete locations. The power of this technique is that a given topographic pattern need only be made perfect once. Thereafter, it can be used whole or in part to realize larger instances or multiple instances of the pattern.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 3A-3C illustrates a process steps of forming a redundant pattern on different areas of a mask substrate using imprint lithography;

FIG. 4 illustrates a flowchart of a process 400 according to the present invention.

DETAILED DESCRIPTION OF EXEMPLARY EMBODIMENTS OF THE INVENTION

Figure 1:
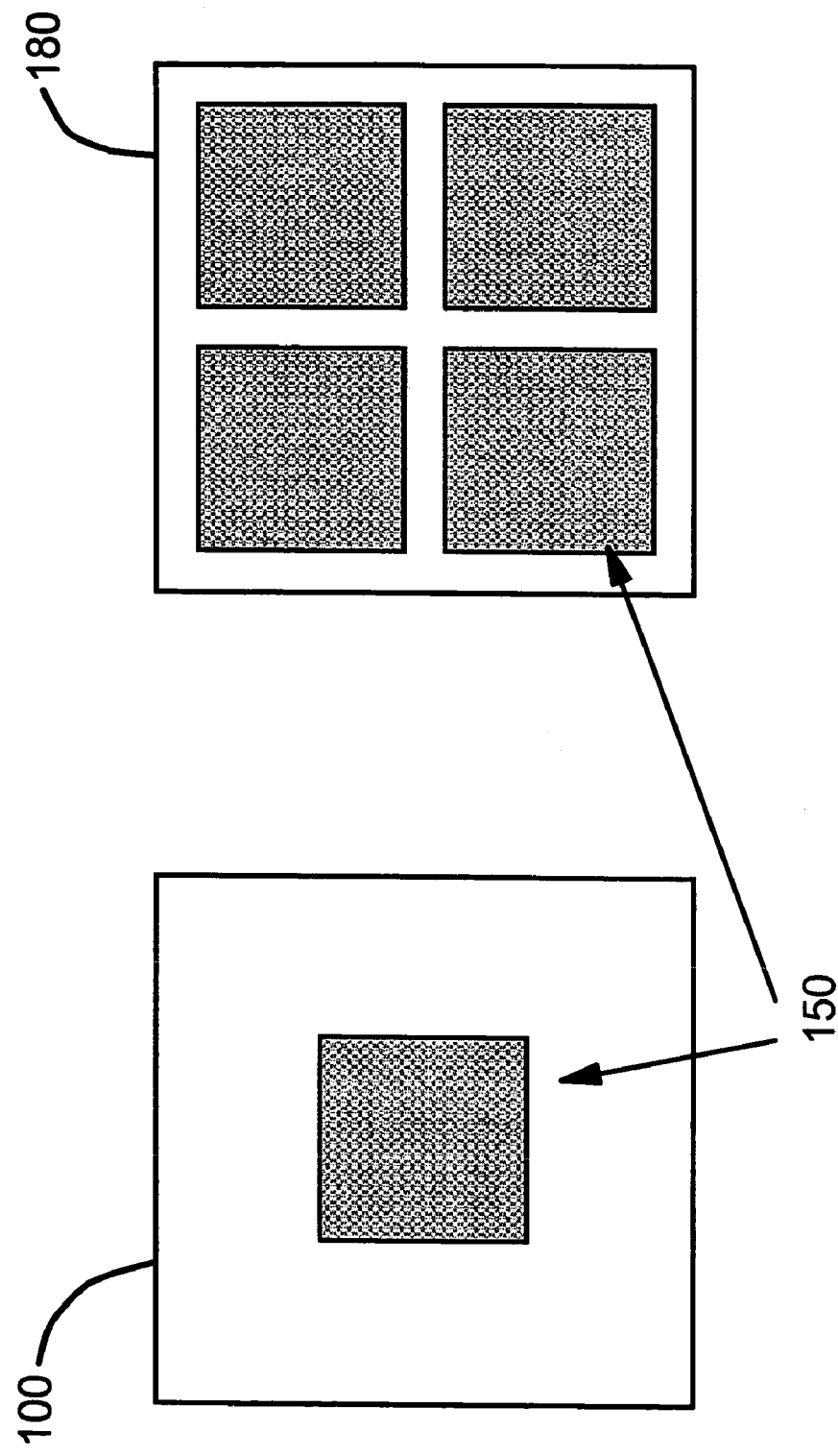
FIG. 1 illustrates a mold 100 of a redundant chip pattern used to produce a multichip array.

Referring now to the drawings, and more particularly to FIGS. 1-5, there are shown exemplary embodiments of the method and structures according to the present invention.

Exemplary Embodiment

Generally, the present invention creates an imprint sub-mask for each redundant region of a given mask which is fabricated one time and then verified. This sub-mask is then used to pattern the redundant regions whenever needed, thereby eliminating the need to verify that portion of the mask and its associated cost.

Thus, for repeating patterns (e.g., for either a whole chip or a portion of a chip, etc.), a multichip array or a macro (e.g., a commonly formed element such as an embedded RAM) can be formed which is standardized and which can be used in many different kinds of chips. The macro is placed on new masks, and that area need not be redundantly made and redundantly inspected, thereby providing a significant reduction in costs. Specifically, the redundant pattern (and its spacing and it alignment, etc.) need not be inspected again, since such has already been inspected on the master. All that needs to be inspected is the non-embedded portions of the "daughter" and the relative positioning of the embedded portions.

As mentioned above, traditional mask making employs photolithography or e-beam techniques to write the pattern in photoresist which is subsequently developed and etched.

This process introduces many distortions and defects that must be individually corrected and inspected. The serial printing and inspection of lithographic masks (or molds) is expensive and time consuming. It is often observed that photo lithographic mask features are typically 4× the final feature ground rule dimensions, and therefore require less precision. The use of phase shift features in optical masks dramatically impacts this observation by introducing additional precision requirements and topography that drive the tolerances to 1×. Thus, using topographically simpler 1× imprint masks to create features is not intrinsically more expensive.

The present invention takes advantage of the one-to-one (1×) character of imprint lithography (i.e., printing masks is identical to printing chips).

Additionally, the present invention is advantageous in its ability of the imprint system to align sub-sections of the mask to achieve overall long range order that is not possible in current e-beam systems.

Turning now to FIG. 1, the present invention involves creating a single imprint mold 100 (e.g., formed of quartz or the like; however, it is noted that the mold can be formed of any suitable material and thus the invention is not limited to the material of the mold) having a redundant chip pattern 150 for each redundant feature, and using this mold 100 to print the redundant feature 150 each time it is needed for a given mask or mold.

Hence, in a first example, as shown in FIG. 1, a multi-chip mask is shown containing a 2×2 chip array 180.

In this process, in a first step, an imprint mold for a single chip is created, and then inspected.

In a second step, the mold 100 is imprinted a plurality of times (e.g., four (4) times as shown in FIG. 1) to create the final mask (or mold).

Thus, FIG. 1 illustrates this situation where the mold 100 is used to create a product mask 180 containing four (4) copies of the master pattern 150. The pattern in this case is a full chip.

Because the "master" pattern 150 (e.g., on the left side of FIG. 1) has been fully qualified (e.g., inspected and verified), it can be used to create copies of itself that are inferred also to be perfect and require much less inspection. Hence, the inspection time and its associated costs are significantly reduced.

Figure 2:
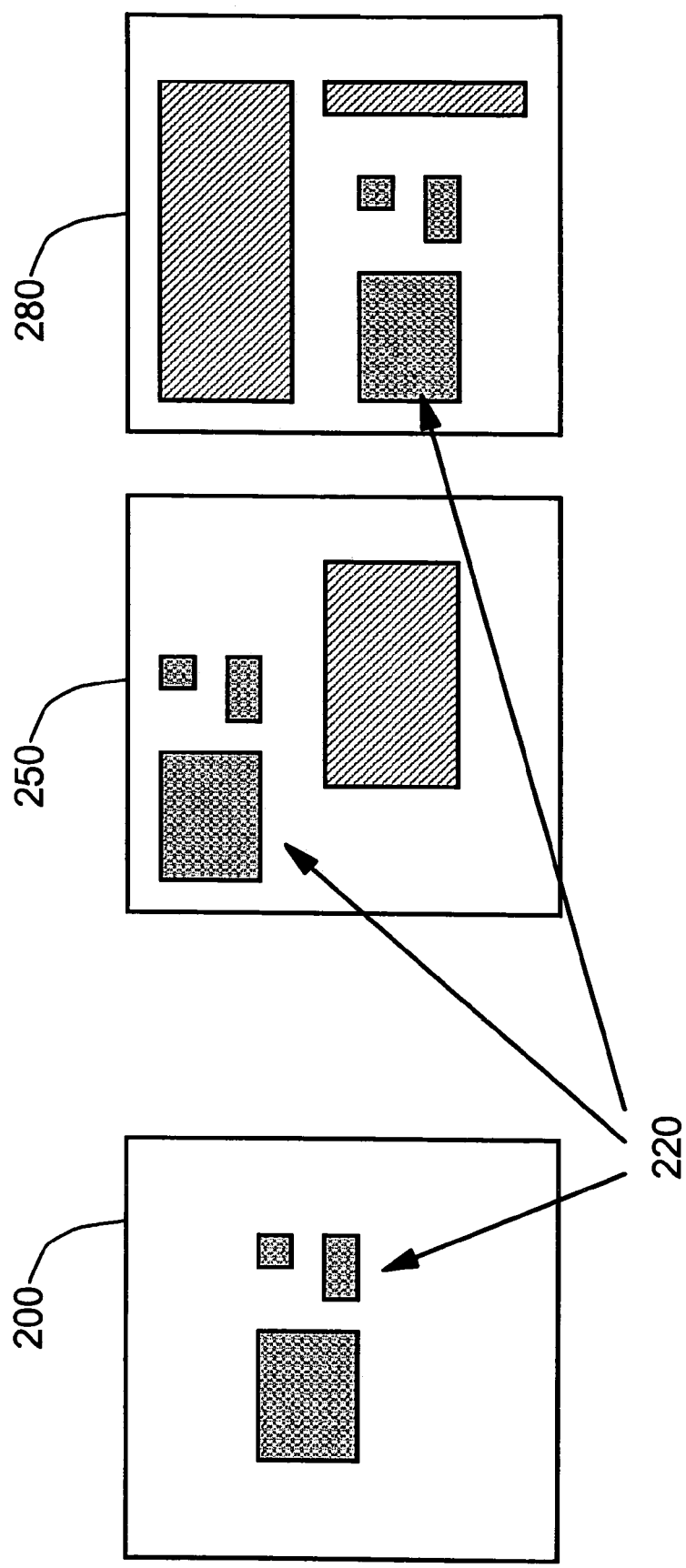
FIG. 2 illustrates a mold 200 of a redundant chip pattern used to produce a redundant pattern 220 in a first product 250 and a second product 280.

Turning to FIG. 2, a multi-product mask 250 (280) is shown containing redundant elements 220.

In this process, first, an imprint mold 200 for a single redundant element 220 is created and inspected. Then, in second step, the mold 220 is imprinted on the multiple product masks 250, 280, etc.

Thus, FIG. 2 illustrates the situation of a commonly-used sub-pattern (e.g., on the left-hand side of FIG. 2) being created and fully qualified. This pattern 220 is then used to print copies of itself wherever needed in subsequent product masks 250, 280 (shown on the right-hand side of FIG. 2). These "daughter" copies of the fully qualified (e.g., inspected and verified) "master" will require much less fabrication and inspection time than the conventional processes.

Thus, collections of redundant pattern masks can be employed similarly to how "macro" files are used in chip design. The inventive process also would provide improved manufacturing consistency since all chips using a given sub-pattern would be spawned from the same "master" without the random act of generating them for each product mask set from scratch.

Fabricating and inspecting the redundant portions of a mold or mask separately and then using the pre-fabricated and verified mold to create subsequent molds or masks eliminates or reduces large amounts of the time and cost of fabricating these elements each time they are used.

In a practical application, the redundant portions of a mold or mask would be fabricated using traditional method (e.g., e-beam patterning in photoresist with subsequent etch or direct etch using a focused ion beam) as in imprint mold.

This mold in turn would be used in an imprint lithography tool to imprint the redundant portions of the pattern on the final masks or molds being fabricated as shown above.

Turning now to FIGS. 3A-3C, the above-mentioned process is illustrated and described below. It is noted that a variety of methods exist for imprint lithography. Some methods involve one or more spun-on polymer coats, whereas others include a single drop liquid application prior to pressing the mold. An exemplary non-limiting case is further described herein depending on the choice of imprint method, the tone of the mask may be inverted in the "daughter" requiring that the "master" be fabricated accordingly. The present invention applies to imprint lithography in the general case.

Turning now to FIG. 3A, first an existing pattern (e.g., previously patterned and processed portion(s) of the mask or mold) on a mask 300 is covered with an etch barrier 305 using conventional lithographic methods (e.g., block mask etc.)

Then, a liquid photoresist 320 is applied to the region being printed on the partially completed final mold or mask A surface polymer coat 310 or the like may be provided over the surface of the mask substrate 300 under the photoresist 320 to improve adhesion and pattern transfer during etch. Then, a transparent imprint die 330 containing the redundant pattern is pressed against the liquid photoresist 320.

Thereafter, as shown in FIG. 3B, the resist 320 is exposed to cure the photoresist (through the imprint die 310), using ultraviolet (UV) light, and then the mold is removed. Then, the resist is touch-up etched, to expose the surface to be etched.

In FIG. 3C, the entire mask or mold is then etched, thereby adding the desired additional redundant features, and the resist is stripped.

FIG. 4 illustrates a flowchart of a process 400 according to the present invention.

Specifically, a method of replicating a pattern on a structure, according to the present invention, includes a first step 410 of creating a single imprint mask or mold having a redundant chip pattern for each redundant feature.

Then, in step 420, the mask or mold is used to lithographically imprint the redundant feature onto a second mask or mold.

With the above-described exemplary features of the present invention, imprint lithography is used to faithfully reproduce the patterns, thereby severely reducing the inspection time. Indeed, since the imprint lithography produces a mask with features with molecular fidelity, in cases calling for a multi-chip mask, one chip pattern can be used as a "master", to produce replicas of the chip which are similarly accurate and which therefore would not need a rigorous inspection.

Thus, the invention uses a cut-and-paste mask making technique in which the chip (or a portion of the chip) is replicated, to take advantage of not having to perform such an involved (as conventional methods) inspection or printing on it.

In addition to chip patterns in the conventional sense, pattern topography information can be cut and pasted with similar cost improvements. Thus, the diblock pattern described above and shown in FIG. 5 can be replicated over large areas or portions placed in discrete locations. Any topography resulting from self assembly, a biological process, an optical interference process etc. can be replicated and copied to other areas, with great advantage.

As mentioned above and as shown in FIG. 5, it is a well known attribute of two-dimensional self assembly processes that long range order is difficult to achieve.

Figure 5:
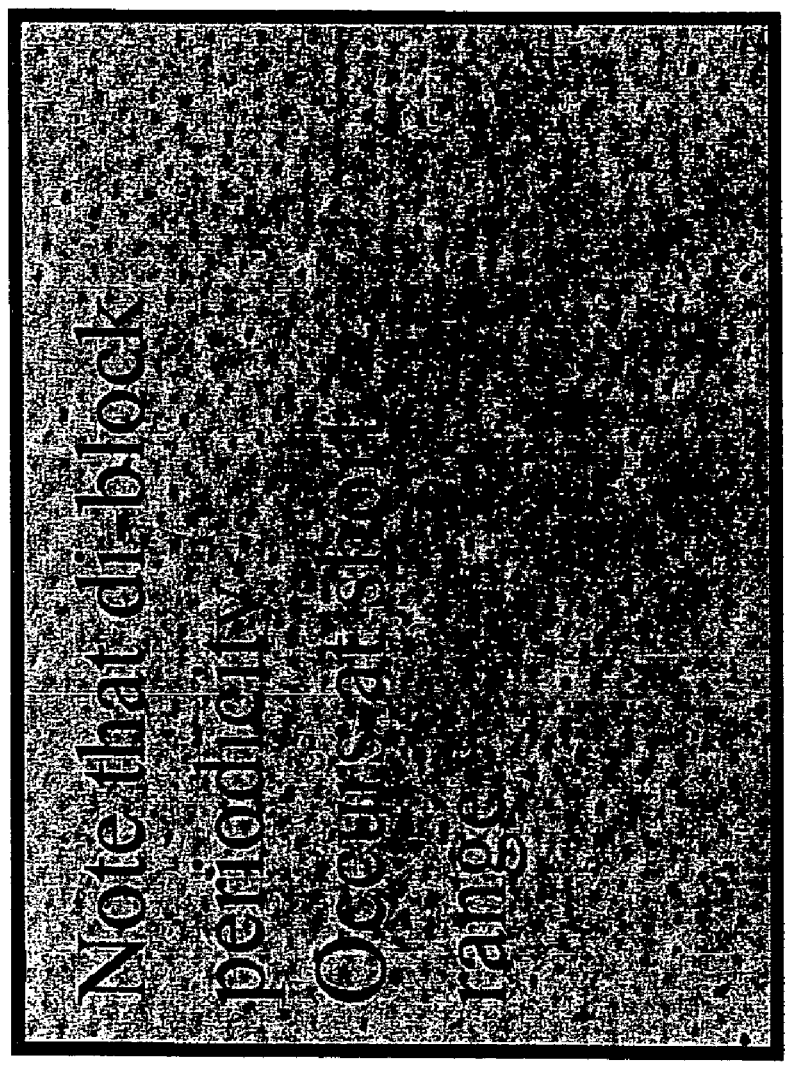
FIG. 5 is a photograph showing a diblock co-polymer film illustrating an application of the invention.

In FIG. 5, the aforementioned diblock copolymer film having a 20 nanometer hole pattern is shown in which there is a clear hexagonal pattern on a local scale, but long range order (i.e., the diblock periodicity) is poor. Such a situation would find great utility with the invention such that if a portion of the pattern can be made perfect, it can be copied and replicated using cut-and-paste imprint lithography and extended to larger areas or used to advantage in discrete locations. The power of this technique (e.g., the inventive technique) is that a given topographic pattern need only be made perfect once. Thereafter, it can be used whole or in part to realize larger instances or multiple instances of the pattern.

Thus, the fundamental implication of the method and system of the present invention is that a perfect pattern once produced can be replicated many times. Consequently, in the case of a patterning process that works with low probability (i.e., self assembly), the invention makes the pattern available for manufacturing.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of forming a redundant pattern on multiple masks or molds, comprising:

forming an imprint mold for a single redundant element and inspecting the imprint mold;

lithographically imprinting the pattern on the mold onto multiple product masks or molds; and covering an existing pattern on the imprint mold with an etch barrier.

2. A method of forming a redundant pattern on multiple masks or molds, comprising:

forming an imprint mold for a single redundant element and inspecting the imprint mold;

lithographically imprinting the pattern on the mold onto multiple product masks or molds;

covering an existing pattern on the imprint mold with an etch barrier;

applying a photoresist to a region being printed on;

providing a surface polymer coat over the surface of a substrate of the mask under the photoresist;

pressing an imprint die containing the redundant pattern against the photoresist;

exposing the resist, and removing the mold;

etching the resist; and etching the entire mask or mold, to add the desired additional redundant features.

3. The method of claim 1, further comprising:

applying a photoresist to a region being printed on.

4. The method of claim 3, further comprising:

providing a surface polymer coat over the surface of a substrate of the mask under the photoresist.

5. The method of claim 4, further comprising:

pressing an imprint die containing the redundant pattern against the photoresist.

6. The method of claim 5, further comprising:

exposing the resist, and removing the mold.

7. The method of claim 6, further comprising:

etching the resist.

* * * * *